United States Patent
Takase

(10) Patent No.: US 7,095,119 B2
(45) Date of Patent: Aug. 22, 2006

(54) SEMICONDUCTOR DEVICE

(75) Inventor: Shunji Takase, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/761,224

(22) Filed: Jan. 22, 2004

(65) Prior Publication Data

US 2005/0067705 A1 Mar. 31, 2005

(30) Foreign Application Priority Data

Sep. 30, 2003 (JP) ............................. 2003-340161

(51) Int. Cl.
*H01L 21/82* (2006.01)
*H01L 29/40* (2006.01)

(52) U.S. Cl. ...................... 257/758; 257/759; 257/760; 257/528; 257/520; 257/530; 438/622; 438/623; 438/133; 438/132

(58) Field of Classification Search ................ 257/529, 257/209, 208, 123, 665, 748, 520
See application file for complete search history.

(56) References Cited

U.S. PATENT DOCUMENTS 6,242,789 B1 * 6/2001 Weber et al. ................ 257/529
2002/0086465 A1 * 7/2002 Houston ...................... 438/149

FOREIGN PATENT DOCUMENTS

JP 04348517 * 12/1992
JP 2000-243213 9/2000

* cited by examiner

*Primary Examiner*—Nathan J. Flynn
*Assistant Examiner*—Fazli Erdem
(74) *Attorney, Agent, or Firm*—VolentineFrancos&Whitt PLLC

(57) ABSTRACT

A semiconductor device is equipped with fuses each made of a conductive material vertically extended through an insulator layer employed in the semiconductor device. Holes are formed which vertically penetrate the insulator layer. Sidewalls are formed on their corresponding wall surfaces of the holes. The holes formed with the sidewalls are buried with a conductive material.

20 Claims, 5 Drawing Sheets

SEMICONDUCTOR DEVICE

BACKGROUND OF THE INVENTION

1. Field of the Invention

The present invention relates to a semiconductor device equipped with fuses and a method of manufacturing the same.

2. Description of the Related Art

In a semiconductor device, a fuse is used to relieve a defect by redundancy substitution in a memory and control or adjust a resistance value employed in a resistance circuit, i.e., trim the resistance value. One example of a conventional fuse is shown in Japanese laid-open Patent No. 2000-243213.

The present fuse is vertically disposed on the surface of a substrate. The fuse penetrates an insulator layer and is connected to a conductive path on the surface of the substrate. The fuse has an advantage that the area occupied by the fuse on a semiconductor chip becomes small owing to the vertical provision of the fuse in this way.

The fuse is blown by Joule heat of a current that flows through the fuse itself. The Joule heat rises as the cross-sectional area thereof becomes small, and the fuse is apt to melt down. The more the fuse is reduced in size, the more the semiconductor device can be scaled down. This is because the size of a portion which is connected to the fuse and causes a fuse blowing current to flow therethrough can be reduced in accordance with the fuse as well as the ability to reduce the size of the fuse.

With the scaling up of an integrated circuit constituting a semiconductor device in particular, the number of fuses mounted on one chip tends to increase. The influence of the sizes of individual fuses on the overall size of the chip is becoming increasingly significant.

Therefore, the conventional fuse has a problem in that its cross-sectional area could be merely reduced to the minimum size defined by a micro-fabrication technique.

SUMMARY OF THE INVENTION

The present invention aims to make it possible to reduce a cross-sectional area of a fuse and thereby to reduce a cross-section of a wiring connected to the fuse.

According to one aspect of the present invention, there is provided a semiconductor device comprising:

a substrate;

a first insulator layer formed on the substrate;

a first conductive layer formed on the first insulator layer;

a second insulator layer formed on the first conductive layer;

a second conductive layer formed on the second insulator layer;

sidewalls each formed on a side face of a hole vertically extended through the second insulator layer; and fuses each formed of a conductive material that buries a space defined inside the sidewall, the fuse having a lower end connected to the first conductive layer and an upper end connected to the second conductive layer.

According to another aspect of the present invention, there is provided a method of manufacturing a semiconductor device equipped with fuses each composed of a conductive material that vertically penetrates an insulator layer, comprising the following steps of:

forming holes each vertically extended through the insulator layer;

forming sidewalls on wall surfaces of the holes respectively; and forming fuses by burying the holes formed with the sidewalls with the conductive material.

According to the present invention, sidewalls are respectively formed inside through holes defined in an insulator layer, and fuses are formed by burying only their inner sides with a conductor. Therefore, the sectional area of the fuse can be set smaller than that of the through hole. It is thus possible to fabricate a fuse having a sectional area less than or equal to a dimensional limitation under a micro-fabrication technique at the formation of the through hole. Accordingly, a cross-section and a line width of a portion connected to the fuse to cause a fusing current to flow therethrough can be reduced as well as the fuse. By extension, the overall size of a semiconductor device can be reduced.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings.

Figure 1:
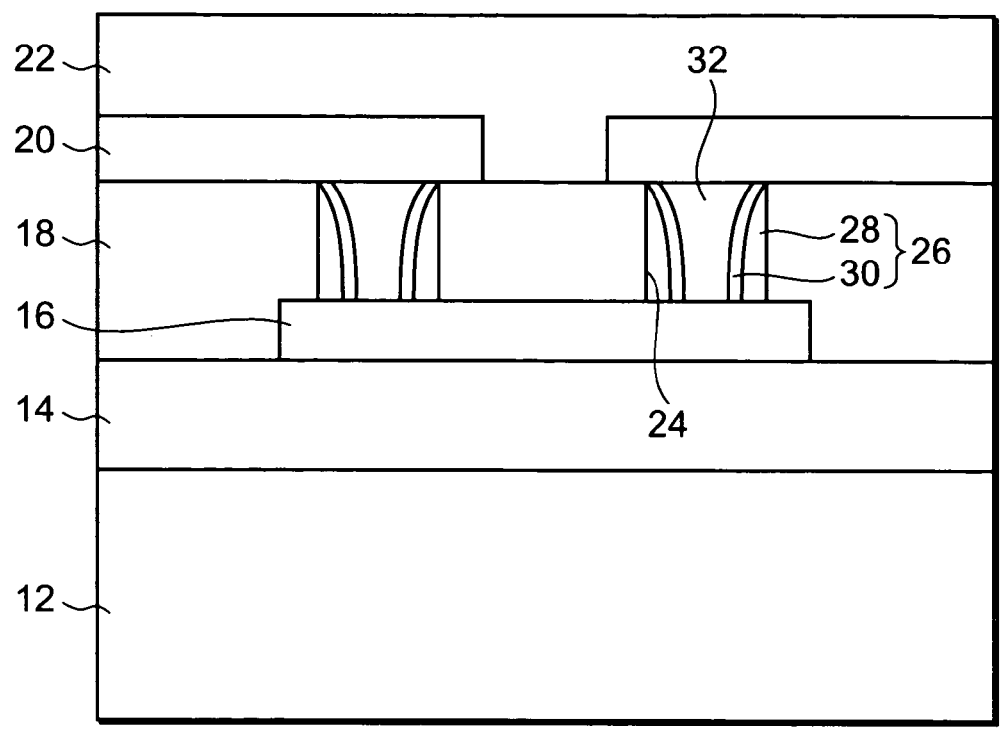
FIG. 1 is a cross-sectional view showing a semiconductor device formed by a manufacturing method thereof according to one embodiment of the present invention.

FIG. 1 shows a semiconductor device 10 according to one embodiment of the present invention. The semiconductor device 10 includes a semiconductor substrate 12, a first insulator layer 14 formed on the semiconductor substrate 12, a first conductive layer 16 formed on the first insulator layer 14, a second insulator layer 18 formed on the first conductive layer 16, a second conductive layer 20 formed on the second insulator layer 18 and a third insulator layer 22 formed on the second conductive layer 20.

The semiconductor substrate 12 is a silicon substrate. The first insulator layer 14 is formed of silicon oxide.

The first conductive layer 16 is formed of a metal such as aluminum. The first conductive layer 16 serves as interconnections. The second insulator layer 18 is formed of silicon oxide.

The second conductive layer 20 is formed of a metal such as aluminum. The second conductive layer 20 serves as interconnections. The third insulator layer 22 is formed of silicon oxide.

The second insulator layer 18 is formed with through holes 24 that penetrate the insulator layer 18 vertically, i.e., in the direction normal to the surface of the semiconductor substrate 12. Sidewalls 26 are formed on their corresponding wall surfaces of the through holes 24.

Each of the sidewalls 26 comprises a first layer 28 formed on the wall surface of the through hole 24 and a second layer 30 formed on the first layer 28 (inside the first layer 28).

The first layer 28 is composed of silicon nitride and the second layer 30 is made of silicon oxide.

A conductor 32 is formed so as to bury a space defined inside each sidewall 26. The conductor 32 constitutes a fuse and connects the first insulator layer 14 and the second insulator layer 18 to each other.

A method of manufacturing a semiconductor device including the fuse 32 will be explained below.

Figure 2:
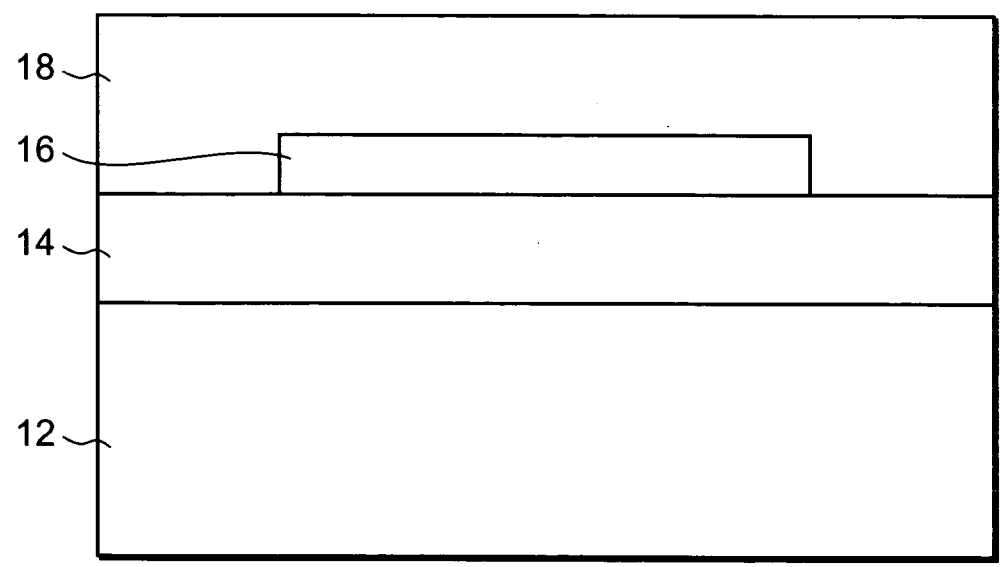
FIG. 2 is a cross-sectional view illustrating a state in which a second insulator layer is formed in the manufacturing method according to the one embodiment of the present invention.

As shown in FIG. 2, a first insulator layer 14 is first formed on a substrate 12. Next, a first conductive layer 16 is formed thereon. The first conductive layer 16 can be formed by forming a metal layer over the entire surface and patterning it. Next, a second insulator layer 18 is formed.

Figure 4:
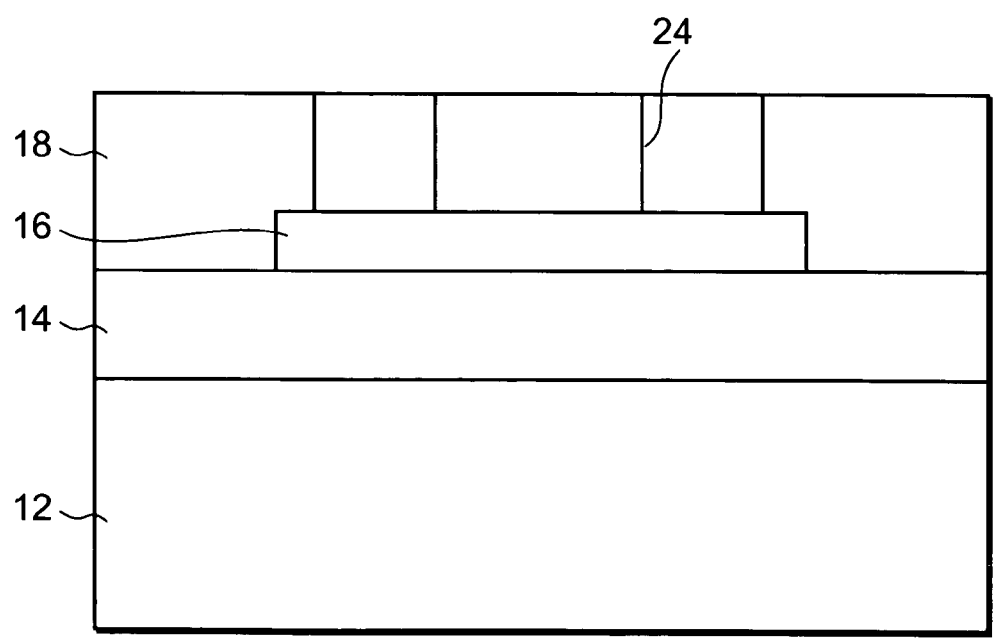
FIG. 4 is a cross-sectional view showing a state in which through holes are defined in the second insulator layer in the manufacturing method according to the one embodiment of the present invention.

Next, as shown in FIG. 4, through holes 24 are defined in the second insulator layer 18. The through holes 24 are respectively circular in section.

Figure 3:
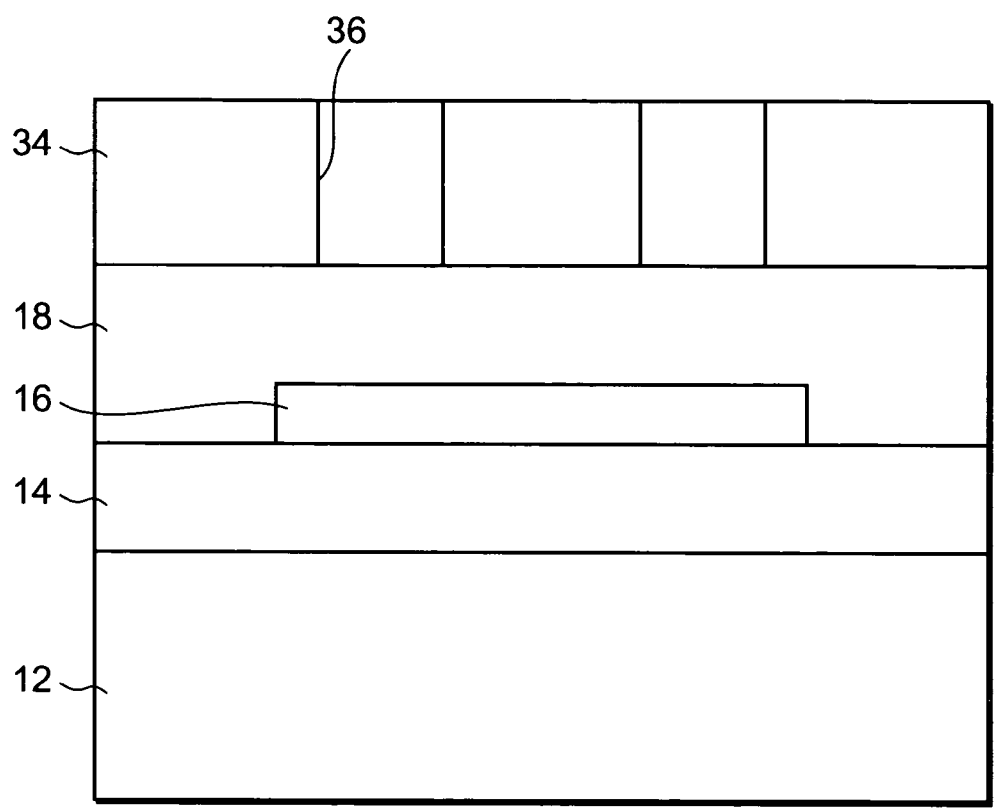
FIG. 3 is a cross-sectional view depicting a state in which a resist pattern is formed in the manufacturing method according to the one embodiment of the present invention.

The formation of the through holes 24 is performed by photolithography. That is, as shown in FIG. 3 by way of example, a resist film 34 is formed over the whole surface of the first conductive layer 16 and selectively exposed, followed by patterning of the resist film 34, whereby a resist pattern 34 having through holes 36 in forming predeterminate regions of the through holes 24 (see FIG. 4) is obtained. The through holes 24 are formed by etching the second insulator layer 18 with the resist pattern 24 as a mask. The size of each through hole 36 defined in the resist pattern 34 is subjected to constraints by resolution of selective exposure.

Figure 5:
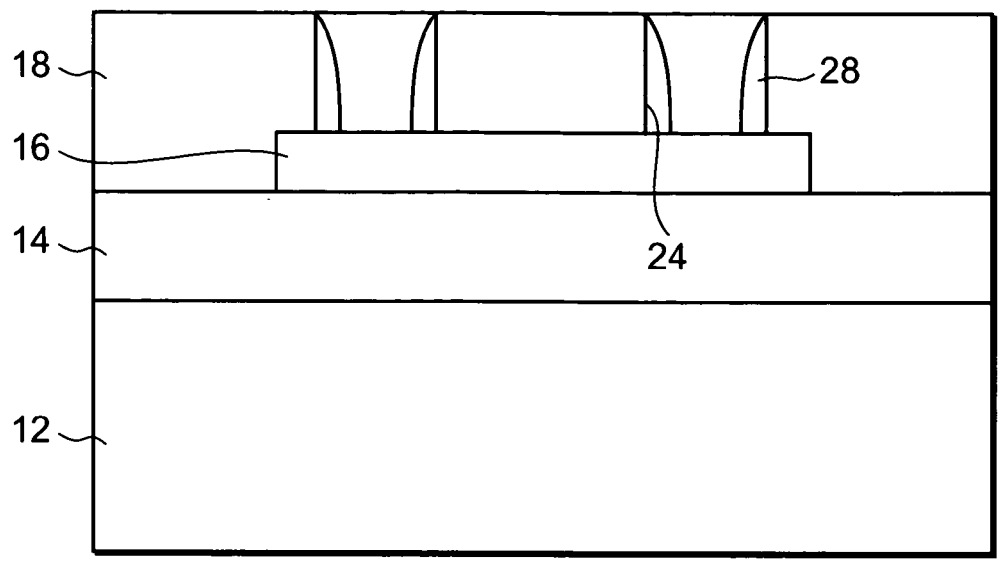
FIG. 5 is a cross-sectional view illustrating a state in which first layers corresponding to sidewalls are formed in the through holes respectively in the manufacturing method according to the one embodiment of the present invention.

Next, as shown in FIG. 5, the resist pattern 34 is removed and a first layer 28 of a sidewall 26 is formed in each through hole 24. For instance, a film of silicon nitride used as a material for the first layer 28 of the sidewall 26 is formed over the entire surface of the substrate by LP-CVD (Low-Pressure CVD) with $SiH_2Cl_2$ and $NH_4$ as gases and thereafter anisotropically etched to form the corresponding first layer 28.

Figure 6:
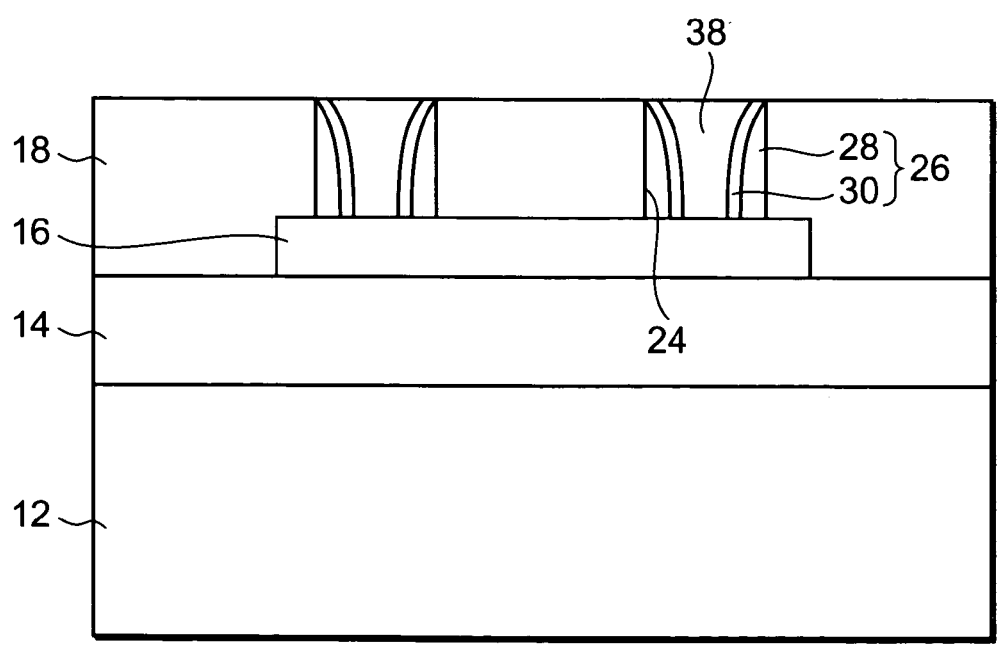
FIG. 6 is a cross-sectional view showing a state in which second layers corresponding to sidewalls are formed in the through holes in the manufacturing method according to the one embodiment of the present invention.

Next, as shown in FIG. 6, a second layer 30 is formed inside the first layer 28 of the sidewall 26 of each through hole 24. For instance, a film of silicon oxide used as a material for the second layer 30 is formed over the whole surface of the substrate by LP-CVD with $SiH_4$ and $N_2O$ as gases and thereafter anisotropically etched to form the corresponding second layer 30.

The first layer 28 and the second layer 30 are formed as described above so that each sidewall 26 is formed. A space 38 extending in the vertical direction is formed inside each sidewall 26.

The first layer 28 and the second layer 30 are both minimized in thickness at a top-end portion (corresponding to a portion farthermost from the substrate 12) of each through hole 24 and gradually increase in thickness as they come to the lower side (they approach the substrate 12). Thus, the overall thickness of the sidewall 26 is smallest at the top-end portion of the through hole 24 and becomes gradually large as it comes to the lower side.

The space 38 has a transverse section substantially circular in a manner similar to the through hole 24 and is smaller in transverse cross-sectional area than the through hole 24. The transverse sectional area of the space 38 is largest at the top-end portion of the through hole 24 with a change in the thickness of the sidewall 26 and becomes gradually small as it reaches the lower side.

Figure 7:
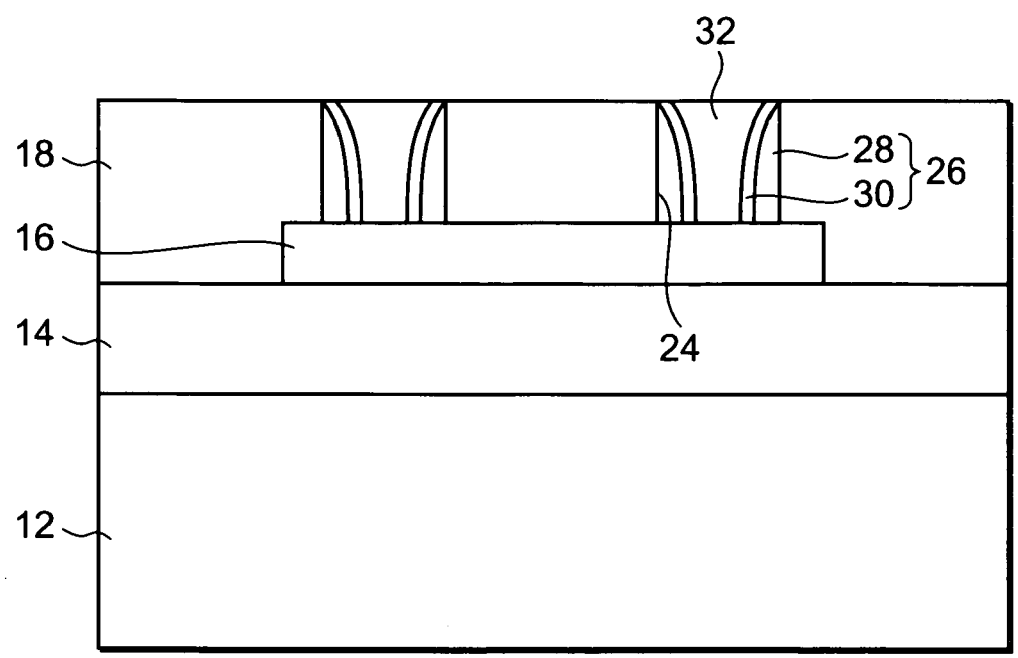
FIG. 7 is a cross-sectional view depicting a state in which spaces defined inside the sidewalls of the through holes are buried with conductors in the manufacturing method according to the one embodiment of the present invention.

Next, as shown in FIG. 7, the space formed inside each sidewall 26 is buried with a conductor material such as aluminum to thereby form a conductor 32 which serves as a fuse. The conductor 32 is connected to the first conductive layer 16 at its lower end.

Figure 8:
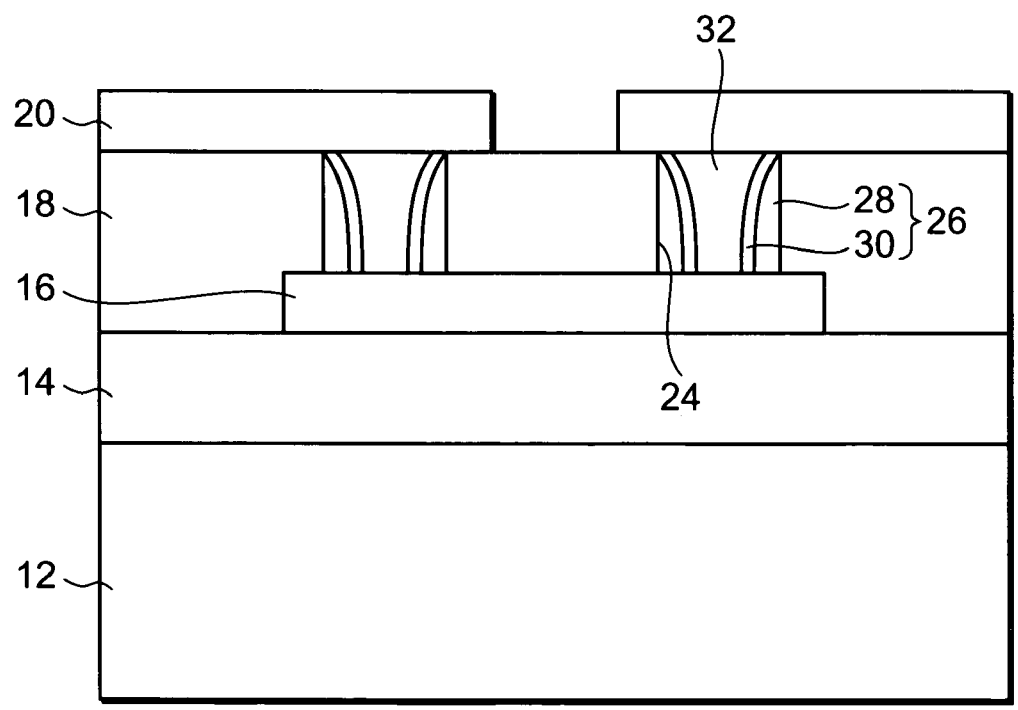
FIG. 8 is a cross-sectional view showing a state in which a second conductive layer is formed in the manufacturing method according to the one embodiment of the present invention.

Next, as shown in FIG. 8, a second conductive layer 20 is formed. The second conductive layer 20 is connected to the conductor 28 at its lower surface.

Next, as shown in FIG. 1, a third insulator layer 22 is formed.

The shape of the conductor 32 used as a fuse is identical to that of the space 38, and its transverse cross-sectional area is smaller than that of the through hole 24. It is thus possible to obtain a fuse having a cross-sectional area smaller than the minimum dimension of the through hole 24 subjected to limitations due to the resolution of exposure and the like.

When the sidewall 26 is formed by the two layers and the first layer 28 brought into contact with the side face of each through hole 24 is formed of the silicon nitride film as in the example described above, the component of the conductor such as aluminum is dispersed when the conductor has molten down by fusion. It is however possible to stop such dispersion by virtue of the silicon nitride film.

Incidentally, when the conductive material formed as the fuse 32 and the material of the second conductive layer 20 are identical in the above embodiment, the process of burying the conductor material formed as the fuse 32 in the space lying in each through hole 24 and the process of forming the second conductive layer 20 can be treated as one continuous process.

On the other hand, when the conductor material formed as the fuse 32 and the material of the second conductive layer 20 are different from each other, the process of embedding the conductor material formed as the fuse 32 into the space formed inside each through hole 24 is executed and thereafter the surface thereof is planarized by CMP (Chemical Mechanical Polishing) or the like. Further, the excess fuse material that overflows from or extends off the space 38 is removed, followed by formation of the second conductive layer 20.

Figure 9:
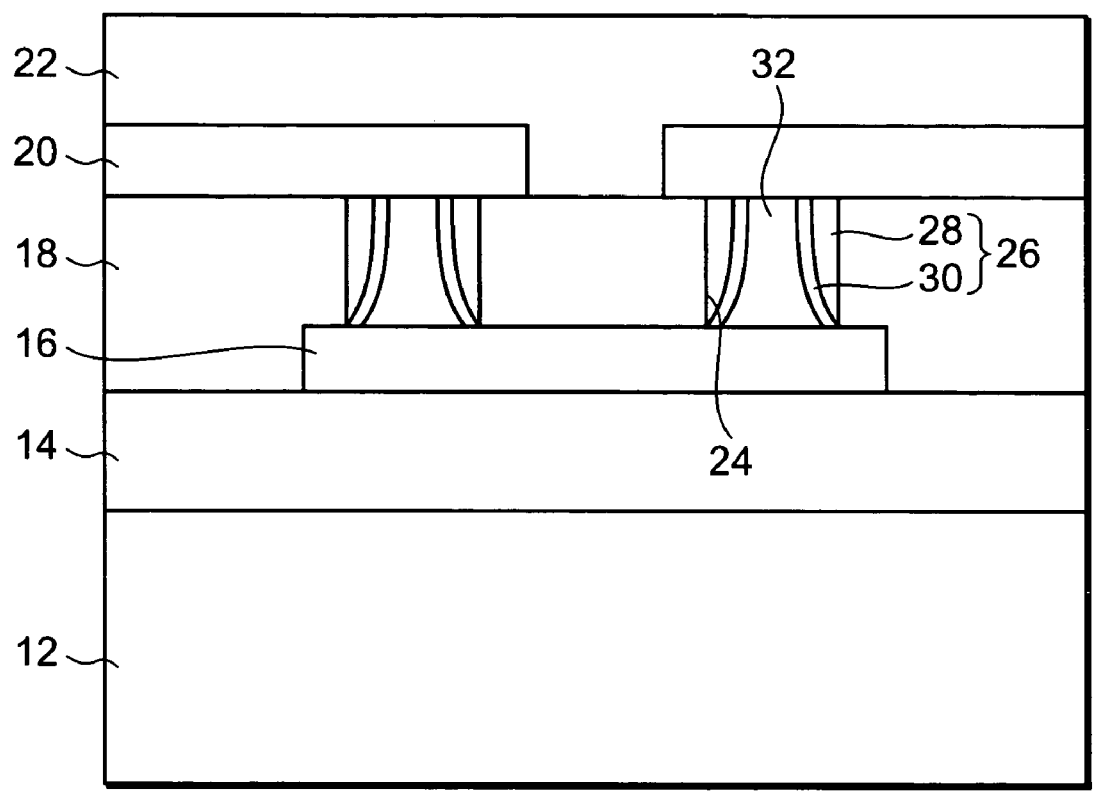
FIG. 9 is a cross-sectional view depicting an example illustrative of sidewalls different from above.

In the aforementioned embodiment, the sidewall 26 is thinnest at the top-end portion of each through hole 24 and becomes gradually thick as it approaches the lower side. With it change, the space 38 formed inside the sidewall 26, accordingly, the transverse sectional area of the fuse 32 formed by burying it is largest at the top-end portion and becomes small as it approaches the lower side. However, as shown in FIG. 9 in reverse, a sidewall 26 thin on its lower side and thick on its upper side is formed and then a fuse 32 having a transverse section large on its lower side and small on its upper side may be formed. A sidewall 26 which is thinnest at its lower end (corresponding to a portion closest to a substrate 12) and becomes thick as it approaches its upper side, is formed and then a fuse 32 having a transverse section which is largest at its lower end and becomes small as it approaches its upper side, may be formed. If done in this way, then the blowing of a fuse becomes easier.

A film of silicon oxide that constitutes a second layer 30 of the sidewall 26 shown in FIG. 9 can be formed by AP-CVD (Atmospheric Pressure CVD) with $SiH_4$ and $O_2$ as gases.

Incidentally, although the conductor that constitutes the fuse 32 has been formed of aluminum in the above embodiment, an alloy composed principally of aluminum may be used. Alternatively, copper (Cu), titanium (Ti), tungsten (W) or an alloy with these as principal components may be adopted.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

The invention claimed is:

1. A semiconductor device comprising:
   a substrate;
   a first insulator layer formed on the substrate;
   a first conductive layer formed on the first insulator layer;
   a second insulator layer formed on the first conductive layer, the second insulator layer including a through hole having a substantially vertical side face;
   a second conductive layer formed on the second insulator layer;
   a dielectric sidewall structure formed on the side face of the through hole so that the dielectric sidewall structure gradually narrows the through hole; and
   a fuse formed of a conductive material that buries the narrowed through hole, said fuse having a lower end connected to the first conductive layer and an upper end connected to the second conductive layer.

2. A semiconductor device according to claim 1, wherein the fuse and the second conductive layer are formed of a same material.

3. A semiconductor device according to claim 1, wherein the dielectric sidewall structure includes a first layer formed on the side face of the through hole and a second layer formed on the first layer.

4. A semiconductor device according to claim 1, wherein a thickness of the dielectric sidewall structure is smallest at the substrate and becomes gradually larger away from the substrate.

5. A semiconductor device according to claim 1, wherein the first and second conductive layers are interconnections.

6. A semiconductor device according to claim 1, wherein the first and second conductive layers are made of aluminum.

7. A semiconductor device according to claim 1, wherein the first and second insulator layers are made of silicon oxide.

8. A semiconductor device according to claim 3, wherein the first layer is formed of silicon nitride and the second layer is formed of silicon oxide.

9. A semiconductor device comprising:
   a semiconductor substrate;
   a first dielectric film formed on the semiconductor substrate;
   a first conductive film formed on the first dielectric film;
   a second dielectric film formed on the first conductive film, the second dielectric film including a through hole that exposes the first conductive film;
   a dielectric sidewall structure formed on a side surface of the through hole so that the dielectric sidewall structure gradually narrows the through hole;
   a conductive material filled in the narrowed through hole; and
   a second conductive film on the second dielectric film and the conductive material, so that the conductive material electrically connects the first and second conductive films to each other.

10. A semiconductor device according to claim 9, wherein the conductive material and the second conductive film are formed of a same material.

11. A semiconductor device according to claim 9, wherein the dielectric sidewall structure includes a first sidewall film formed on the side surface of the through hole and a second sidewall film formed on the first sidewall film.

12. A semiconductor device according to claim 9, wherein a thickness of the dielectric sidewall structure is smallest at the semiconductor substrate and becomes gradually larger away from the semiconductor substrate.

13. A semiconductor device according to claim 9, wherein the first and second conductive films are made of aluminum.

14. A semiconductor device according to claim 9, wherein the first and second dielectric films are made of silicon oxide.

15. A semiconductor device according to claim 11, wherein the first sidewall film is formed of silicon nitride and the second sidewall film is formed of silicon oxide.

16. A semiconductor device comprising:
   a semiconductor substrate;
   a first conductive film formed on the semiconductor substrate;
   a dielectric film formed on the first conductive film and the semiconductor substrate, the dielectric film having a through hole that exposes the first conductive film;
   a dielectric sidewall structure formed in the through hole so that the through hole is gradually narrowed by the dielectric sidewall structure to expose the first conductive film;
   a fuse structure formed by a conductive material filled in the narrowed through hole; and
   a second conductive film on the dielectric film and the fuse structure, so that the fuse structure electrically connects the first and second conductive films to each other.

17. A semiconductor device according to claim 16, wherein the second conductive film is formed of the conductive material.

18. A semiconductor device according to claim 16, wherein the dielectric sidewall structure includes a first sidewall film formed on a side surface of the through hole and a second sidewall film formed on the first sidewall film.

19. A semiconductor device according to claim 16, wherein the first and second conductive films are made of aluminum.

20. A semiconductor device according to claim 16, wherein the dielectric film is made of silicon oxide.

* * * * *